United States Patent [19]

Parker et al.

[11] 4,023,124
[45] May 10, 1977

[54] ACOUSTIC SURFACE WAVE DEVICES

[75] Inventors: David William Parker, Reigate; David Edward Penna, Earlwood; Frederick Warren Smith, Sutton; Richard Stevens, Copthorne, all of England

[73] Assignee: U.S. Philips Corporation, New York, N.Y.

[22] Filed: July 29, 1975

[21] Appl. No.: 600,148

[30] Foreign Application Priority Data

Aug. 2, 1974  United Kingdom ............. 34190/74

[52] U.S. Cl. .................................. 333/72; 310/9.8; 333/30 R
[51] Int. Cl.$^2$ ..................... H03H 9/04; H03H 9/26; H03H 9/32; H01L 41/10
[58] Field of Search ............... 333/30 R, 72; 310/8, 310/8.1, 8.2, 9.8

[56] References Cited

UNITED STATES PATENTS 3,699,364  10/1972  Gerard ............................... 310/9.8
3,835,422   9/1974  Hartemann ......................... 333/72

Primary Examiner—Alfred E. Smith
Assistant Examiner—Marvin Nussbaum
Attorney, Agent, or Firm—Frank R. Trifari; Bernard Franzblau

[57] ABSTRACT

A length weighted interdigital transducer has λ/2 spaced electrodes within the overlap region. Outside the overlap region, the overlapping λ/2 spaced electrodes are connected to the bus bars by pairs of λ/4 spaced electrodes and extra "dummy" pairs of λ/4 spaced electrodes are also connected to the bus bars. The λ/2 spaced electrodes give a good manufacturing yield, and the λ/4 spaced pairs of electrodes and pairs of dummy electrodes provide compensation for wavefront distortion combined with low "interactions."

18 Claims, 11 Drawing Figures

ACOUSTIC SURFACE WAVE DEVICES

The invention relates to an acoustic surface wave device including a body of piezoelectric material on one surface of which is formed a transducer including an interdigital array of two sets of electrodes. The two sets of electrodes are each connected to one of two opposite bus bars, while each electrode of a set of electrodes has a part which overlaps a part of an adjacent electrode of the opposite set. The overlapping electrode parts are at an effective spacing of a half wavelength of acoustic surface waves at a frequency $f_o$. Furthermore, the length of the overlapping electrode parts varies along the line of acoustic surface wave propagation through the transducer, the limits of the envelope of the overlapping electrode parts normal to the propagation line defining the acoustic aperture of the transducer.

The use of acoustic surface waves has enabled devices, such as frequency selective filters, to be manufactured which are small, compact and are moreover compatible with integrated circuit manufacturing techniques.

Such an acoustic surface-wave filter is commonly formed by a thin wafer of piezoelectric material on one surface of which a launching and a receiving transducer are arranged respectively to launch and to receive an acoustic surface wave propagating over the surface. Each transducer normally comprises an interdigitated array of two sets of electrodes, the array being formed, for example, by a photolithographic process from a layer of a suitable metal deposited on the surface of the wafer.

The frequency response of such a surface wave filter is determined by the number, spacing and dimensions of the electrodes of the two transducers. In order to obtain a desired frequency response for a specific transducer it is common practice to vary the overlap of the adjacent electrodes of the two sets of electrodes of said transducer in a pre-determined manner ("length-weighting"). The limits of the envelope of said overlapping electrode parts define the acoustic aperture of the transducer.

Such a transducer is subject to two undesired secondary effects which may disturb the desired frequency response and so degrade the performance of the device. The first secondary effect is generally termed "interaction." Each electrode of a transducer partially reflects the acoustic surface waves produced by each of the other electrodes and moreover partially converts these waves into an electrical signal, which in its turn is then re-radiated by said electrode as an acoustic surface wave. These reflections and re-radiations will be additive in a conventional transducer having its electrodes at an effective spacing of half a wavelength of the acoustic surface waves, so as to produce ripples in the amplitude-frequency response and the phase-frequency response of the transducer in the transmission band.

The second secondary effect is the wavefront distortion of the acoustic surface wave owing to the varying overlap of the transducer electrodes. The velocity of acoustic surface waves is affected by travelling under a metalized surface. However, within the aperture of a transducer with varying overlap of the electrodes the number of metal electrodes in the path of the acoustic surface wave also varies across the aperture, thus giving rise to said wavefront distortion.

It is an object of the invention to provide a device in which said two secondary effects are economically and drastically reduced. The device according to the invention is therefore characterized in that the transducer comprises at least one group of conductive strips normal to the propagation line, which strips extend outside said envelope and within the aperture and are electrically connected in common, and that adjacent strips within the group are at an effective spacing of an odd integral multiple of a quarter wavelength of acoustic surface waves at the frequency $f_o$.

It is to be noted that in a paper entitled "Applications of double electrodes in acoustic surface wave device design" by T. W. Bristol et al presented to the Proc. IEEE Ultrasonics Symposium, October 1972, a solution is proposed for the secondary effect of reflections which entails that each electrode is divided into two separate electrodes. However, there are two main disadvantages to this method. As the divided electrodes are substantially narrower than the conventional electrodes, fabrication errors are more likely to result in breaks in or short-circuits between electrodes, so that the yield of good devices in manufacture is significantly reduced. Furthermore, a transducer with such split electrodes has an amplitude response which is the same for the fundamental and the third harmonic modes. This means that if only the fundamental mode is to be used the third harmonic mode must be suppressed with the aid of additional filter networks.

Furthermore, it is to be noted that in "Applied Physics Letters," 1 Dec. 1971, Volume 19, Number 11, pages 456 to 459, a solution is proposed for the secondary effect of wavefront distortion. This solution is to insert extra electrodes outside the overlap envelope. These electrodes consequently do not contribute to the generation of acoustic surface waves, but equalise the number of metal electrodes across the aperture of the transducer. However, this method has the disadvantage of increasing the said interactions, thus increasing the ripples in the desired response curves.

However, the step according to the invention effectively mitigates said two secondary effects without producing any harmful consequences. The invention is based upon the appreciation of a certain combination of properties of a conventional transducer with varying overlap envelope of the electrodes (length-weighted). Firstly, only those parts of the electrodes within the overlap envelope contribute to the generation or reception of acoustic surface waves. Secondly, it is the varying length of those electrode parts which results in wavefront distortion. Thirdly, those parts of the electrodes outside the envelope already compensate for that wavefront distortion. Fourthly, those parts of the electrodes outside the envelope contribute to said interactions.

Therefore, if according to the invention those parts outside the envelope take the form of double electrodes, the "interactions" will be significantly reduced without the generally undesired third harmonic mode being generated. Furthermore, the step according to the invention will not significantly reduce the production yield of good devices since the overlappying electrode parts are not split and the charge on such an overlapping electrode part will not be affected by either a break in one of the split parts or a short-circuit between them.

As, according to the invention, extra split electrodes may also be introduced outside the overlap envelope this enables the wavefront distortion to be further reduced without significantly increasing interactions.

The invention will be described hereinafter with reference to the accompanying drawing, in which:

FIG. 2B illustrates the known method of reducing interactions, while

Figures 8A, 8B:
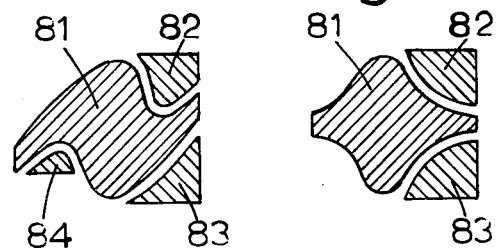
Figure 8C:
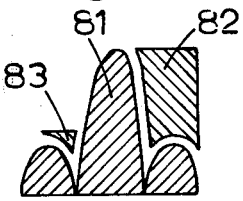

FIGS. 8a, 8b, and 8c show in schematic form variations of the overlap envelope of a transducer, together with the resulting variations in the number, shape and size of the groups of metallic strips according to the invention outside the overlap envelope.

Figure 1:
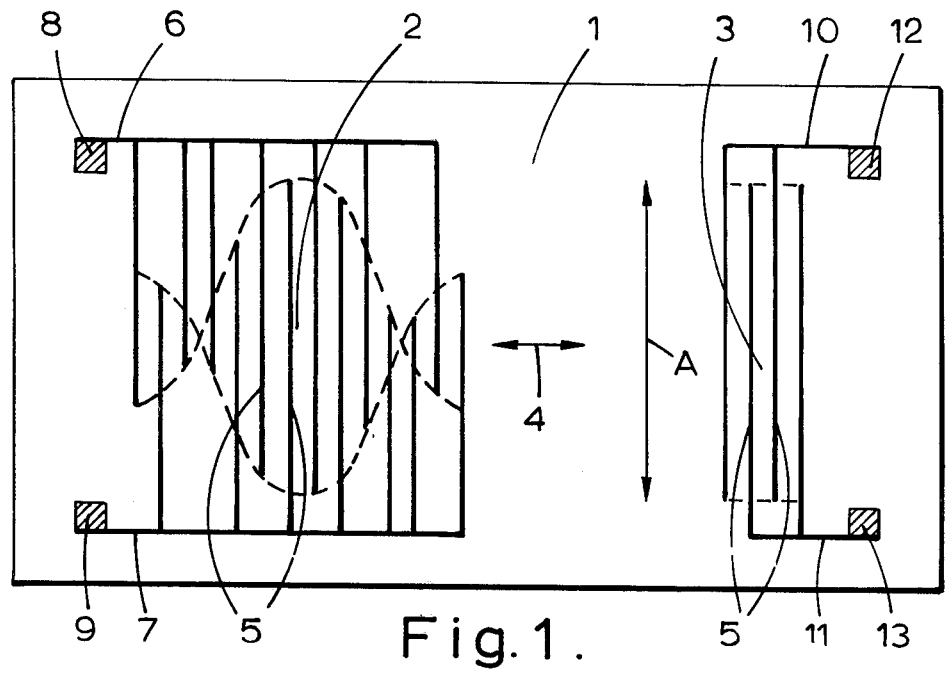
FIG. 1 shows a schematic plan view of a conventional surface wave filter.

FIG. 1 shows schematically in plan view a conventional acoustic surface wave filter which can be used as an intermediate frequency filter for a television receiver. A body 1 in the form of a wafer of piezoelectric material has applied to its upper surface a launching transducer 2 and a receiving transducer 3. The transducers include interdigital arrays of electrodes formed on the surface of the body 1, suitably by photolithography from a vapour-deposited layer of metal.

The interdigital electrode array of the launching transducer 2 is adapted to emit acoustic surface waves in a direction 4. The interdigital electrode array of the receiving transducer 3 is arranged in the path of the acoustic surface waves launched by the transducer 2 and is adapted to receive said acoustic surface waves launched by the transducer 2. Each interdigital array comprises two sets of strip electrodes 5, each set being connected to one of two opposite bus bars. The bus bars 6, 7 lead to respective input terminals 8, 9 of the launching transducer 2 to which an input signal can be applied. The bus bars 10, 11 lead to respective output terminals 12, 13 of the receiving transducer 3, at which an output signal is available.

The frequency response of the filter is the combined frequency response of the two transducers. The electrodes 5 are at an effective spacing of a half wavelength of acoustic surface waves at a frequency $f_o$, which frequency may be the same or different for the two transducers. Each electrode 5 has a part which overlaps a part of an adjacent electrode 5 connected to the opposite bus bar, and the shape of the envelope of the overlapping electrode parts of each transducer, shown in dotted outline, is designed to produce a required amplitude-frequency response for each transducer.

The limits of the envelope of the overlapping electrode parts normal to the propagation line 4 define the acoustic aperture A of each transducer. In FIG. 1 the transducer 2 is length-weighted, i.e. the length of the overlapping parts of the electrodes 5 varies along the propagation line 4 through that transducer, whereas the transducer 3 is a "uniform" transducer, i.e. the length of the overlapping parts of the electrodes 5 does not vary along the propagation line 4 through that transducer.

The conventional acoustic surface wave filter described above with reference to FIG. 1 is designed to have a desired frequency response. However, it is subject to various secondary effects which can produce unwanted perturbations in that frequency response and thereby degrade its performance. Two of these secondary effects, i.e. interactions and wavefront distortion, will be discussed hereinafter.

Within an interdigital array acoustic surface wave transducer, the electrodes partially reflect acoustic surface waves which propagate in the surface underneath said electrodes, and said acoustic surface waves also generate an electrical signal in said electrodes which results in re-radiation of surface waves. These reflections and re-radiations, which can together be called interactions, will be additive in a conventional transducer having its electrodes at an effective spacing of half a wavelength of acoustic surface waves at a frequency $f_o$, so as to produce ripples in the amplitude-frequency and phase-frequency response of the transducer in the region of that frequency $f_o$.

Figure 2A:
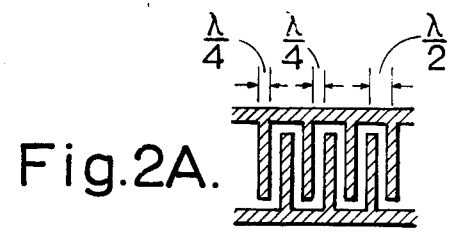
FIG. 2A shows the conventional electrode geometry used therein.
Figure 2B:
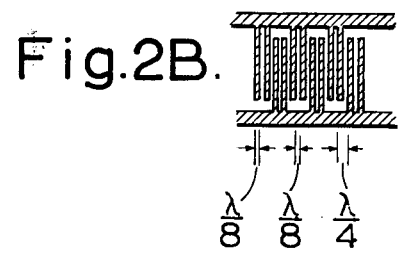

The above described problem of reflections is recognised and a solution proposed in the cited paper entitled "Applications of double electrodes in acoustic surface wave device design" by T. W. Bristol et al presented to the Proc. IEEE Ultrasonics Symposium, October 1972, where it is said that by dividing each electrode into a split pair the reflections cancel at the center frequency since the periodicity of the discontinuities is doubled. It is also said that double electrodes couple to both the fundamental and third harmonic modes with essentially equal strength while retaining the inherent reflection suppression for both modes. FIGS. 2A and 2B for illustration purposes show a conventional acoustic surface wave transducer geometry and a double electrode transducer geometry as illustrated in the Proc. IEEE paper.

FIG. 2A shows that in a conventional transducer the width of the electrodes as well as the spacing between them is $\lambda4$, $\lambda$ being the wavelength of the acoustic surface wave at the frequency $f_o$, the central frequency of the transmission band. This geometry results in an effective electrode spacing of $\lambda/2$.

In the electrode array proposed in the cited paper, shown in FIG. 2B, each conventional electrode is formed into a so-called double electrode. This double electrode consists of two separate electrodes each having a width and a mutual spacing of $\lambda/8$, which results in an effective electrode spacing of $\lambda/4$. This electrode array, shown in FIG. 2B, has two main disadvantages.

The first disadvantage is that fabrication errors are more likely to result in breaks in the electrodes or shorts between them, and so the yield of good devices in manufacture is reduced. In particular, a break which severs a major part of only one of the long electrodes in the length-weighted transducer of the filter shown in FIG. 1 may throw the filter out of the desired response specification.

In an intermediate frequency television filter fabricated on a chip of bismuth silicon oxide, the width of the electrodes and the gaps between them are for example $10/\mu$ using the conventional electrode geometry of FIG. 2A, but are only $5/\mu$ using the double electrode geometry of FIG. 2B. In this case the use of a double electrode geometry may therefore result in a significant reduction in the fyield of good devices.

The second disadvantage is the substantially equal amplitude response of a double electrode transducer at both its fundamental and third harmonic modes. In the case of a transducer having the conventional electrode geometry of FIG. 2A, i.e. where the electrodes are at an effective spacing of half a wavelength at a frequency $f_o$, the width of the electrodes is the same as the gaps between them and the electrodes are alternately connected to the two bus bars, the individual electrode response is zero at the frequency $3f_o$ and so the response of the transducer at that frequency is suppressed. However, in the case of a transducer having the double electrode geometry of FIG. 2B, i.e. where the electrodes are at an effective spacing of a quarter of a wavelength at a frequency $f_o$, the width of the electrodes is the same as the gaps between them and the electrodes are connected in pairs to the two bus bars, the individual electrode response is not zero at the frequency $3f_o$ and so the response of the transducer at that frequency is not suppressed. Thus in the case of an acoustic surface wave device which is required to have a band-pass frequency response about a frequency $f_o$, e.g. an intermediate frequency television filter, more stringent requirements may be placed on the external electrical circuits associated with the acoustic surface wave device to ensure that they do not respond at the frequency $3f_o$ and thus spoil the stop-band response of the filter.

The problem of wavefront distortion arises with length-weighted interdigital array acoustic surface wave transducers, in which the length of the overlapping electrode parts varies along the line of acoustic surface wave propagation through the transducer. Referring to FIG. 1, the wavefronts of acoustic surface waves travelling from the transducer 2 both towards and away from the transducer 3 are made up of waves generated at the position of each electrode 5 within the transducer. The velocity of acoustic surface waves is affected when they travel under a metalized surface on a piezoelectric material, and thus the waves generated from the position of each electrode 5 suffer a velocity change which varies across the aperture of the transducer 2 as the number of metal electrodes 5 in the path of these waves varies across the aperture. In the case of the particular overlap envelope of the transducer 2 in FIG. 1, the waves midway across the aperture A travel under approximately double the number of electrodes as do the waves at the outer edges of the aperture A. The resulting wavefront distortion affects the performance of an acoustic surface wave device which is designed under the assumption that the wavefronts are straight.

Figure 3:
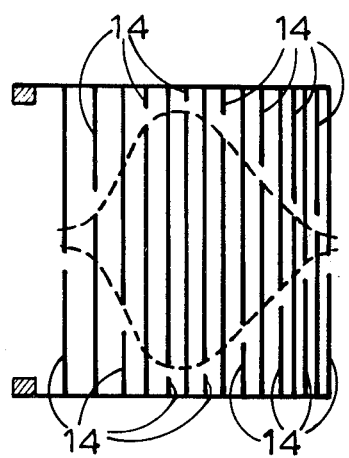
FIG. 3 illustrates the known method of reducing wavefront distortion.

In the cited Applied Physics Letters, Dec. 1, 1971, Volume 19, Number 11, at pages 456 to 459, the above-described problem of wavefront distortion is recognised and a solution proposed which is to insert extra electrodes which are connected to the bus bars but which are not "active". These extra electrodes are outside the existing overlap envelope, and two adjacent electrodes are always connected to the same bus bar, and so that do not contribute to the generation of acoustic surface waves by the transducer. However, they equalise the "metal path length" across the aperture of the transducer and serve to keep the wavefront plane. FIG. 3 of the accompanying drawings shows an interdigital array acoustic surface wave transducer with variable overlap (length-weighted) as illustrated in the Applied Physics Letters paper having the above-mentioned extra electrodes 14 outside the overlap envelope (shown in dotted outline).

We have found that while the introduction of extra electrodes, as suggested in the previous paragraph, into the transducer 2 of the conventional filter shown in FIG. 1 does indeed reduce the wavefront distortion, it nevertheless has the disadvantage of increasing those ripples in the amplitude-frequency and phase-frequency response of the transducer in the region of the frequency $f_o$ which are due to interactions.

Figure 4:
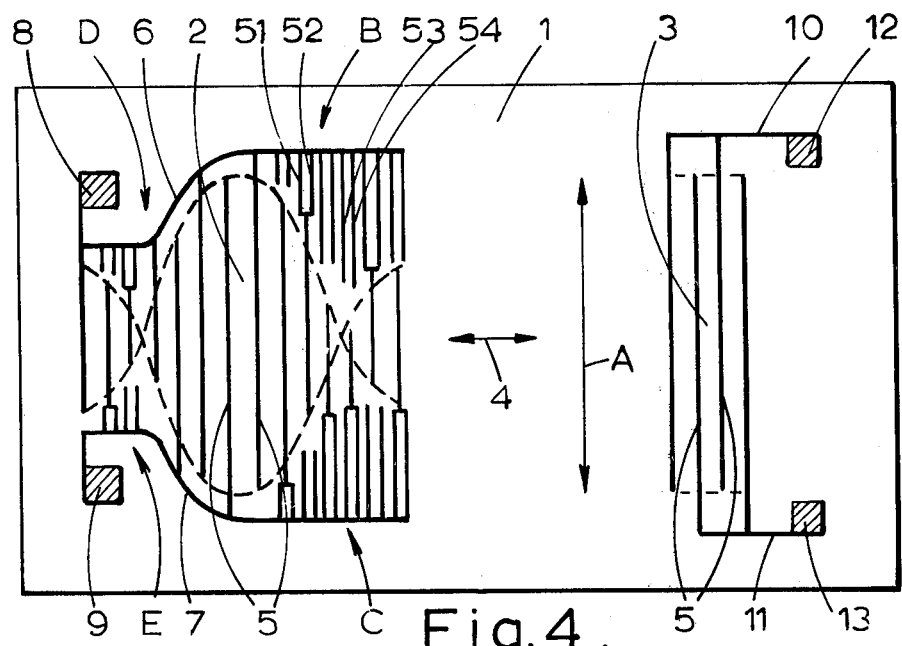
FIG. 4 shows a plan view of an acoustic surface wave filter according to the invention.

Referring now to FIG. 4, which shows a device according to the invention, a body 1 in the form of a wafer of piezoelectric material has applied to its upper surface a launching transducer 2 and a receiving transducer 3. The transducers include interdigital arrays of electrodes formed on the surface of the body 1, suitably by photolithography from a vapour-deposited layer of metal.

The interdigital electrode array of the launching transducer 2 is adapted to direct acoustic surface waves parallel to the line of propagation 4. The interdigital electrode array of the receiving transducer 3 is arranged in an acoustic surface wave path with the transducer 2 and is adapted to receive acoustic surface waves launched towards it by the transducer 2. Each interdigital array comprises two sets of strip electrodes 5, each set being connected to one of two opposite bus bars. The bus bars 6, 7 lead to respective input terminals 8, 9 of the launching transducer 2, and the bus bars 10, 11 lead to respective output terminals 12, 13 of the receiving transducer 3.

Each electrode 5 has a part which overlaps a part of an adjacent electrode 5 connected to the opposite bus bar. The overlapping parts of the electrodes 5 of each transducer are at an effective spacing of a half wavelength of acoustic surface waves at a frequency $f_o$, which frequency may be the same or different for the two transducers, and the shape of the envelope of the overlapping electrode parts of each transducer, shown in dotted outline, is designed to produce a required amplitude-frequency response for each transducer. The frequency response of the filter is the combined frequency response of the two transducers.

The limits of the envelope of the overlapping electrode parts normal to the propagation line 4 define the acoustic aperture A of each transducer. The transducer 2 is length-weighted, i.e. the length of the overlapping parts of the electrodes 5 varies along the propagation line 4 through the transducer. The transducer 3 is a uniform transducer, i.e. the length of the overlapping parts of the electrodes 5 does not vary along the propagation line 4 through that transducer.

Figure 5:
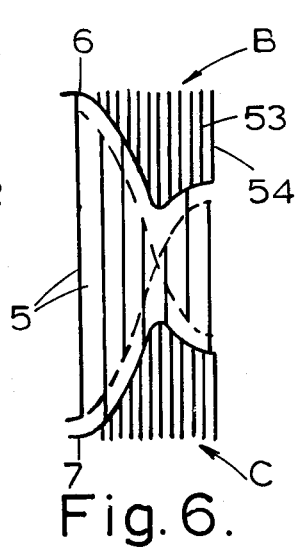
FIG. 5 shows, in enlarged detail, part of the electrode geometry of the transducer in the device of FIG. 4.

Considering the transducer 2 in more detail, in four separate regions B, C, D and E of that transducer the parts of the electrodes 5 outside the overlap envelope are split into electrode pairs such as for example the pair 51, 52. Furthermore, within the regions, B, C, D and E extra electrode pairs such as the pair 53, 54 are disposed, which are connected to the bus bars 6 and 7 outside the overlap envelope. The electrode pairs 51, 52 and the extra electrode pairs 53, 54 thus form four groups of metallic strips normal to the propagation line 4 outside the overlap envelope and substantially within the aperture A. The strips within each group are electrically connected in common and are at an effective spacing of a quarter of a wavelength of acoustic surface waves at the frequency $f_o$ for the transducer 2. FIG. 5 shows part of the transducer 2 in enlarged detail. The width of the overlapping electrode parts 5 and the gaps between them are a quarter of the wavelength of acoustic surface waves at the frequency $f_o$. The width of the metallic strips 51, 52, 53, 54 and the gaps between them are an eighth of the wavelength of acoustic surface waves at the frequency $f_o$.

The particular positioning and shaping of the regions B, C, D and E will now be explained.

The launching transducer 2 will launch acoustic surface waves from the position of each electrode 5 in both directions along the propagation line 4. However, means (not shown) are provided, e.g. wax pads at the two ends of the body 1, to absorb acoustic surface waves other than those which pass directly between the two transducers 2 and 3. The number of groups B, C, D, E of metallic strips 51, 52, 53, 54, the number of strips within each group, and the length of each strip are preferably chosen such that compensation for wavefront distortion is provided for waves launched towards the receiving transducer 3 but not for waves launched away from the receiving transducer 3.

Thus the groups B and C extend from those electrodes 5 having the long overlapping parts near the centre of the transducer 2 to the end of the transducer 2 nearest the transducer 3 over the whole of the aperture A, so as to equalise the metal path length for the waves generated from those long overlapping electrode parts of the transducer 2 towards the transducer 3. The groups D and E fill in the remaining hollows n the overlap envelope as far as is necessary to equalise the metal path length for the waves generated towards the transducer 3 from those overlapping electrodes 5 furthest away from the transducer 3.

Within the groups B, C, D and E, the quarter wavelength spacing of the strips 51, 52, 53 and 54 will reduce interactions within the groups. The reduced size of the groups D and E, and the shaping of the bus bars 6 and 7 which as it were follow the overlap envelope between the groups B and D and between the groups C and E further reduces interactions.

An advantage of the shaped bus bars 6 and 7 which may be mentioned at this point is that the terminals 8 and 9 are accommodated within the length of the transducer 2, so saving cost on the size of the piezoelectric body 1 required for the device.

Figure 6:
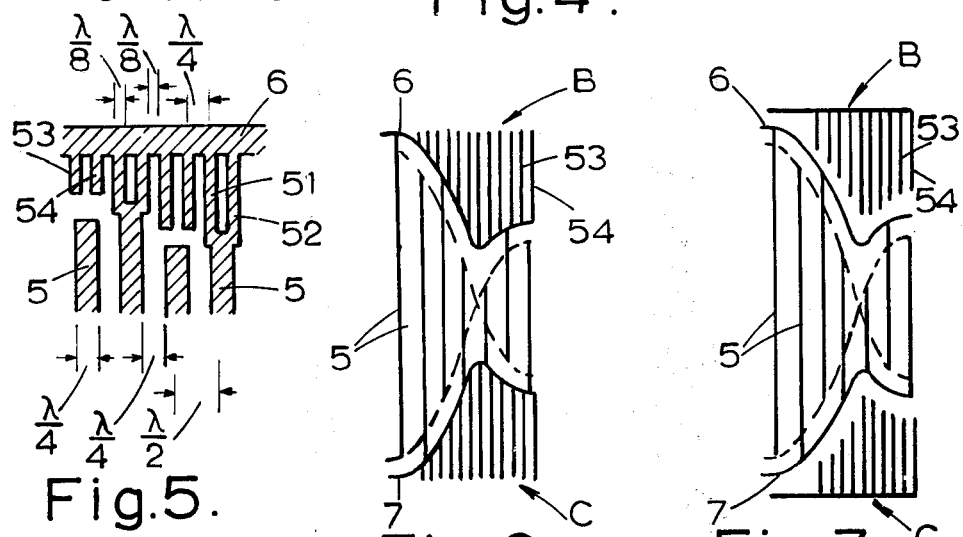
FIGS. 6 and 7 show part of the transducer of the device of FIG. 4 so as to illustrate modifications thereof.
Figure 7:
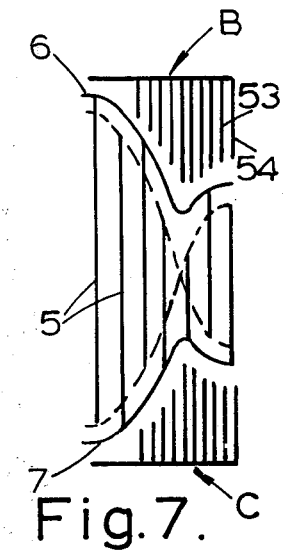

FIG. 6 shows the half of the transducer 2 of FIG. 4 nearest the transducer 3 modified in that the bus bars 6 and 7 are shaped to follow the overlap envelope. The overlapping parts of the electrodes 5 are not split outside the envelope but are directly connected to the bus bars 6 and 7. The regions B and C are occupied wholly by pairs of extra electrodes 53, 54, one such pair in each region corresponding to each electrode 5, for wavefront correction with low interactions. The electrodes 53, 54 in each region B and C are electrically connected in common by being connected to the respective bus bars 6 and 7. FIG. 7 shows a variation on FIG. 6 in that the electrodes 53, 54 in each region B and C are electrically connected together without being connected to the respective bus bars 6 and 7. Although not illustrated, it will be appreciated that the regions D and E of the transducer 2 shown in FIG. 4 can be modified in the same manner as has been shown in FIGS. 6 and 7 for the regions B and C. The advantage of the bus bars 6 and 7 being shaped to follow the overlap envelope as shown in FIGS. 6 and 7 is that the closer connection of the overlapping parts of the electrodes 5 to their respective bus bars should improve the yield in manufacture. The disadvantage is that the presence of the bus bars 6 and 7 in the path of waves generated from the transducer 2 towards the transducer 3 will introduce some wavefront distortion.

FIGS. 8A, 8B and 8C show, in more schematic form, some variations in the shape of the overlap envelope 81 of a length-weighted transducer together with resulting variations in the number, shape and size of the groups of metallic strips 82, 83, 84 outside the overlap envelope. In relation to each group of metallic strips 82, 83, 84 the bus bars may be as shown in FIG. 4 or as shown in FIG. 6 or FIG. 7. In FIGS. 8A, 8B and 8C a two-transducer device is assumed, with the second transducer on the right-hand side of the transducer shown.

Some further possible variations within the scope of the invention will finally be discussed. As shown in FIG. 5, the width of the overlapping parts of the electrodes 5 and the gaps between them are a quarter of the wavelength of acoustic surface waves at the frequency $f_o$. An advantage of this particular dimensioning is that the individual electrode response is zero at the frequency $3f_o$ and so the response of the transducer at that frequency is suppressed. However, some variation in this width to gap ratio is permissible within the constraint that the overlapping electrode parts are at an effective spacing of a half wavelength of acoustic surface waves at the frequency $f_o$. As shown in FIG. 5 the width of the metallic strips 51, 52 53, 54 and the gaps between them are an eighth of the wavelength of acoustic surface waves at the frequency $f_o$. However, the objective of low interactions will be achieved so long as adjacent strips within a group, or each group, are at an effective spacing of a quarter or an odd integral multiple of a quarter wavelength of acoustic surface waves at the frequency $f_o$. The arrangement of the groups of metallic strips outside the overlap envelope of the length-weighted transducer as shown in FIGS. 4 to 8 is such as to provide compensation for wavefront distortion of waves launched towards a second transducer but not for waves launched away from that second transducer. If required however, e.g. in the case of a three transducer arrangement, the groups of metallic strips outside the overlap envelope can be arranged so as to provide compensation for wavefront distortion of waves launched in both directions along the line of propagation through the length-weighted transducer. The invention has been described above in terms of a length-weighted launching transducer. The length-weighted transducer can, of course, equally well be operated as a receiving transducer.

What is claimed is:

1. An acoustic surface wave device comprising a body of piezoelectric material on one surface of which is formed a transducer including an interdigital array of two sets of electrodes with each set connected to one of two opposite bus bars, each electrode of a set of electrodes having a part which overlaps a part of an adjacent electrode of the opposite set and with the overlapping electrode parts having an effective spacing of a half wavelength of acoustic surface waves at a frequency $f_o$, the length of the overlapping electrode parts varying along the line of acoustic surface wave propagation through the transducer with the limits of the envelope of the overlapping electrode parts normal to the propagation line defining the acoustic aperture of the transducer, and at least one group of conductive strips normal to the propagation line, which strips extend outside said envelope and within the aperture and are electrically connected in common, adjacent strips within the group being at an effective spacing of an odd integral multiple of a quarter wavelength of acoustic surface waves at the frequency $f_o$.

2. An acoustic surface wave device as claimed in claim 1, wherein the conductive strips of the group are connected to one of the bus bars, some of the strips of the group being in pairs which form part of one of the sets of electrodes, each said pair of strips connecting an overlapping electrode part to its respective bus bar.

3. An acoustic surface wave device as claimed in claim 1 further comprising a second transducer arranged on said one surface of the body, the first transducer being adapted to launch a surface wave and the second transducer to receive said surface wave, characterized in that the number of groups of strips, the number of strips within each group, and the length of each strip are chosen so that compensation for wavefront distortion is obtained for waves launched towards the second transducer but not for waves with an opposite direction of propagation.

4. An acoustic surface wave device as claimed in claim 1 wherein the width of the overlapping electrode parts and the gaps between them are a quarter of the wavelength of acoustic surface waves at the frequency $f_o$.

5. An acoustic surface wave device as claimed in claim 1 wherein the width of the strips and the gaps between them are an eighth of the wavelengths of acoustic surface waves at the frequency $f_o$.

6. An acoustic surface wave device comprising a piezoelectric substrate able to propagate acoustic surface wave energy, first and second spaced apart transducers coupled to a surface of the substrate and each including an interdigitated array of two sets of parallel electrodes, one of said transducers comprising, a pair of elongated spaced apart conductive members extending generally in the direction of acoustic surface wave propagation through the transducer, and two sets of electrodes extending transversely to said propagation direction with one set of electrodes connected to a first one of said conductive members and the other set of electrodes connected to a second one of said conductive members, adjacent electrodes of said two sets of electrodes being spaced a half wavelength at a frequency $f_o$ and having a transverse overlap which varies along the propagation direction whereby the envelope formed by the ends of the overlapping electrodes defines the acoustic aperture of the transducer, and a group of conductive strips extending transverse to the propagation direction and located outside of said envelope and within the aperture and electrically connected together in common, adjacent strips within the group having an effective spacing of an odd integral multiple of a quarter wavelength of the acoustic surface waves at the frequency $f_o$.

7. An acoustic surface wave device as claimed in claim 6 wherein the spacing between said first and second elongated conductive members varies along the propagation direction.

8. An acoustic surface wave device as claimed in claim 6 wherein the spacing between said first and second elongated conductive members varies in a given region so as to follow the overlap envelope formed by the ends of the overlapping electrodes in said region.

9. An acoustic surface wave device as claimed in claim 7 wherein the overlapping electrodes are a quarter wavelength wide and are spaced apart a quarter wavelength of the acoustic surface waves at the frequency $f_o$.

10. An acoustic surface wave device as claimed in claim 9 wherein the width of the conductive strips and the gaps therebetween are an eighth of a wavelength of the acoustic surface waves at the frequency $f_o$.

11. An acoustic surface wave device as claimed in claim 7 wherein the width of the conductive strips and the gaps therebetween are an eighth of a wavelength of the acoustic surface waves at the frequency $f_o$.

12. An acoustic surface wave device as claimed in claim 6 wherein the conductive strips are arranged in two opposed groups of strips extending from opposite sides of the transducer with each group connected in common to its adjacent elongated conductive member.

13. An acoustic surface wave device as claimed in claim 7 wherein the conductive strips are arranged in two opposed groups of strips extending from opposite sides of the transducer with each group connected in common to its adjacent elongated conductive member.

14. An acoustic surface wave device as claimed in claim 6 wherein some but not all of the conductive strips are arranged in pairs and are connected pair-wise to individual electrodes of said one transducer for connecting said electrodes to respective ones of said elongated conductive members.

15. An acoustic surface wave device as claimed in claim 6 wherein the conductive strips are arranged in pairs between adjacent electrodes of said two sets of electrodes.

16. An acoustic surface wave device as claimed in claim 6 wherein the width of the conductive strips and the gaps therebetween are each an eighth of a wavelength of the acoustic surface waves at the frequency $f_o$.

17. An acoustic surface wave device comprising a body of piezoelectric material one surface of which supports a transducer including an interdigital array of two sets of electrodes with each set connected to one of two opposed bus bars, each electrode having a part which overlaps a part of an adjacent electrode of the opposite set, the length of the overlapping electrode parts varying along the line of acoustic surface wave propagation through the transducer and with the limits of the envelope of the overlapping electrode parts normal to the propagation line defining the acoustic aperture of the transducer, said two bus bars being shaped to follow the overlap envelope formed by the overlapping electrodes, and at least one conductive area arranged on said one surface in a region outside of the envelope but within the acoustic aperture so that said conductive area compensates for wavefront distortion due to the varying lengths of the overlapping electrode parts, said conductive area extending over a distance, along the line of wave propagation through the transducer, that is proportional to the sum of the widths of those electrodes for whose varying lengths it provides compensation.

18. An acoustic surface wave device as claimed in claim 17 wherein the shape and size of the conductive area is arranged to complement the overlap envelope.

* * * * *

UNITED STATES PATENT AND TRADEMARK OFFICE
CERTIFICATE OF CORRECTION

PATENT NO. : 4,023,124
DATED : May 10, 1977
INVENTOR(S) : DAVID WILLIAM PARKER ET AL

It is certified that error appears in the above-identified patent and that said Letters Patent are hereby corrected as shown below:

Col. 2, line 58, after "Therefore" "if" should be deleted and after "invention" there should be inserted --,if--

Col. 4, line 68, "fyield" should be --yield--

Col. 7, line 29, after "hollows" "n" should be --in--

Claim 6, line 9, "and" should be --said--.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks